United States Patent [19]

Tardiff et al.

[11] 4,034,893

[45] July 12, 1977

[54] MACHINES FOR SEQUENCING DIVERSE COMPONENTS WITH COMPONENT SEPARATING AND GUIDING SURFACE

[75] Inventors: Armand L. Tardiff, Salem; Glover F. Broughton, Marblehead; David R. Delorey, Beverly; Bangt R. Pearson, Magnolia, all of Mass.

[73] Assignee: USM Corporation, Boston, Mass.

[21] Appl. No.: 649,908

[22] Filed: Jan. 16, 1976

Related U.S. Application Data

[62] Division of Ser. No. 570,842, April 23, 1975, Pat. No. 3,971,193.

[51] Int. Cl.² .................. H01R 43/00; B65H 5/26
[52] U.S. Cl. ........................... 221/171; 198/481; 221/225
[58] Field of Search ......... 53/198 R, 200; 198/481; 221/9, 172, 225, 253, 266, 171; 29/203 B

[56] References Cited

U.S. PATENT DOCUMENTS

| | | | |
|---|---|---|---|
| 2,896,213 | 7/1959 | Alderman et al. | 29/203 B |
| 3,618,192 | 11/1971 | Hoffken | 29/203 B |
| 3,669,309 | 6/1972 | Romeo | 221/225 |
| 3,799,322 | 3/1974 | Van Linder et al. | 198/481 |

Primary Examiner—Robert B. Reeves
Assistant Examiner—David A. Scherbel
Attorney, Agent, or Firm—Carl E. Johnson; Richard B. Megley; Vincent A. White

[57] ABSTRACT

For uniformly positioning and closely spacing in a row electrical lead-bearing components of different types, including those having disc-shaped bodies to be disposed in overlapping relation, lead controlling means and component body positioning means coact with a conveyor conducting the components to be secured as by tape in selected sequence.

5 Claims, 10 Drawing Figures

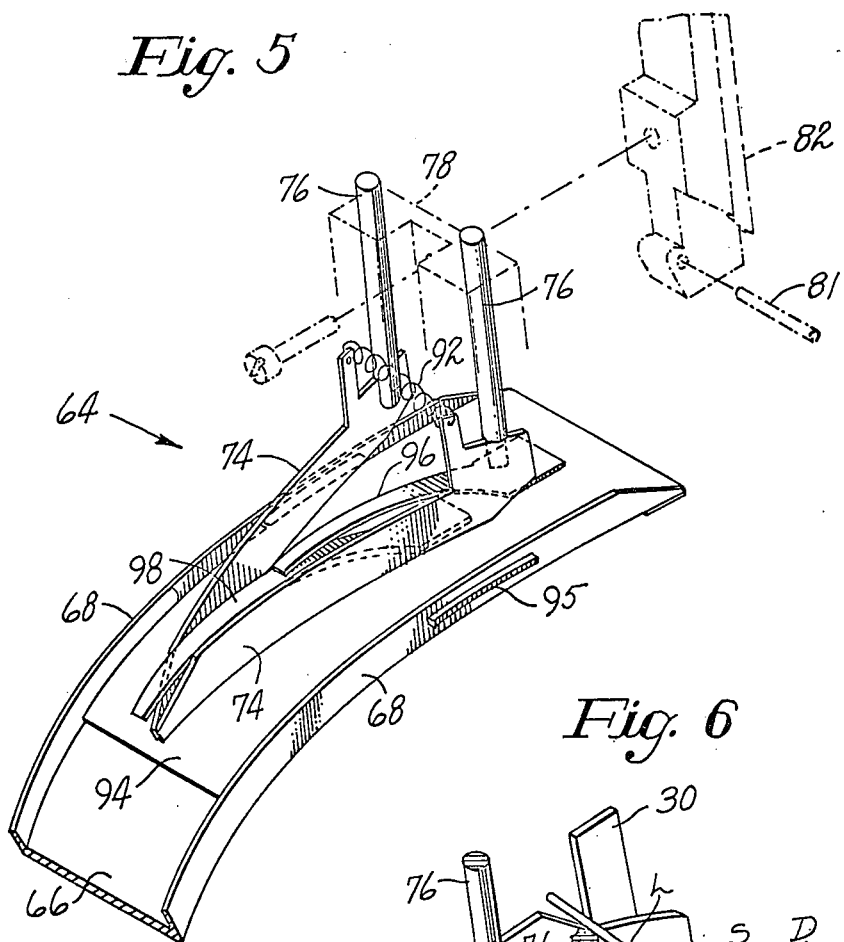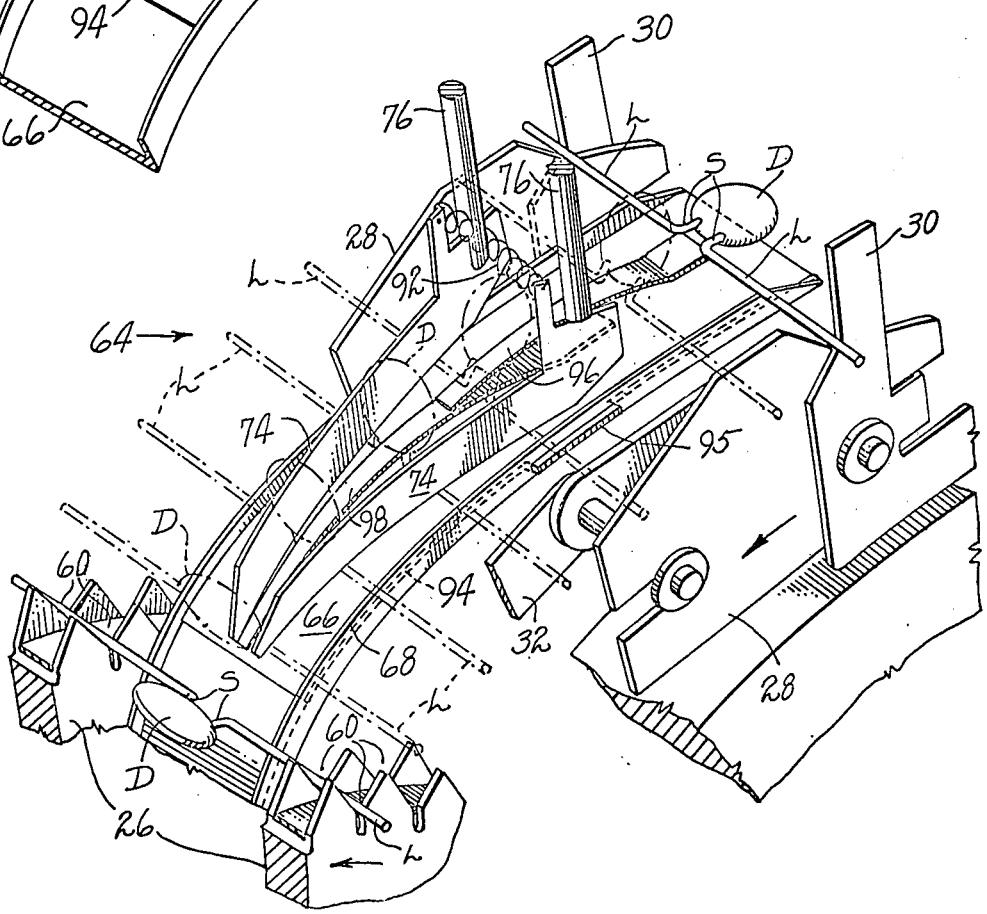

MACHINES FOR SEQUENCING DIVERSE COMPONENTS WITH COMPONENT SEPARATING AND GUIDING SURFACE

CROSS REFERENCE TO RELATED APPLICATION

This is a division of application Ser. No. 570,842, filed Apr. 23, 1975, application 570,842 has matured to U.S. Pat. No. 3,971,193.

U.S. application Ser. No. 537,341 filed Dec. 30, 1974 in the name of Ralph Morrison et al. relates to mechanisms for forming and inserting component leads, and in some respects pertains to component orienting, but preparatory to direct lead insertion.

BACKGROUND OF THE INVENTION

This invention pertains to mechanism for assembling different forms of electrical components with their bodies and leads accurately oriented in side by side relation to facilitate their subsequent feeding and connection by automatic mechanism into printed circuits or the like.

In U.S. Pat. No. 3,669,309 issued June 13, 1972 in the name of Vincent Romeo, for instance, there is disclosed a machine for taping in pre-programmed sequence a plurality of electrical components which have been released from their respective dispensers. Another machine of this general sequencing type is disclosed, for example, in U.S. Pat. No. 3,421,284 issued Jan. 14, 1969. These patented sequencing machines deliver coaxial leads of components having similar shaped bodies via a conveyor to mechanism for applying tapes whereby the successive (geneally cylindrical) components can subsequently be fed in the desired order to appropriate automatic mechanism for inserting and electrically connecting their leads in printed circuits. There is, however, a practical limitation to the usefulness of such sequencing apparatus; they are not, so far as known, capable of dealing with any stand-off components or components the body shapes of which differ significantly from cylindrical, at least not without non-uniformly spacing and disorienting the successive components. Non-uniformly spaced components cannot be fed to the lead cutting, forming and inserting instrumentalities of automatic component mounting machines in a manner to aheive electrical connections with the very high degree of reliability required in the industry. Moreover, unless component bodies, especially those having stand-off lead portions, are properly inclined with respect to feed tape or the like interconnecting them and trail their respective leads, the mounting machines cannot effect lead formation and insertion without danger of damaging the components and/or the boards.

One illustrative type of common component having a configuration different from cylindrical and which it is particularly advantageous to be able to include in a mixed or programmed sequence of diverse taped components is the "disc cap". It generally has a disc-like body ranging in the order of from about three-sixteen inch to about three-fourths inch in diameter in one general plane and many be flatly elliptical in cross section. Its two leads usually extend in spaced parallel relation from one edge of the body; the lead portions remote from the body may be coaxial as is usually but by no means necessarily the case with cylindrical body components. In general it is preferred to maintain lead portions adjacent to the disc bodies substantially parallel in order to provide for "stand-off", i.e. enable shoulder portions of the leads to support their component body spaced from the circuit board to which they ultimately are to be mounted. In order to dispose sequenced disc caps and other shaped component bodies, cylindrical and otherwise, in a compact storage and feeding formation, for instance wound reels, usable thereafter in automatic inserting machines necessitates inclusion of orienting mechanism in the sequencing apparatus, for instance as hereinafter disclosed.

SUMMARY OF THE INVENTION

In view of the foregoing it is a main object of this invention to provide an improved machine for producing a programmed series of interconnected electrical components the body and lead shapes of which may be dissimilar yet uniformyl aligned and oriented to be connected in compact arrangement.

Another and more specific object of this invention is to provide lead controlling and body orienting means in a component sequencing machine whereby the components, even when of different body sizes and shapes, can be taped in selected order with uniform spacing for subsequent feeding from a reel in an inserting machine.

A further object is to provide a component sequencer capable of uniformly and compactly packaging different types of lead-bearing components and whether they, or random ones of them, are preformed with stand-off lead portions.

To these ends, and as herein illustrated, there is provided in cooperative combination with a conveyor of a sequencing machine, for instance of the type referred to in the mentioned Romeo patent, yieldable laterally spaced, pivotal component centering members, and a yieldable component body supporting means arranged to at least potentially frictionally engage the body of each component between its leads as it is moved toward a lead taping zone by the conveyor between said members and apply body orienting torque about coaxial portions of the leads as they are slidably restrained by the members.

A feature of the means for imparting body orienting torque, as herein illustrated, which greatly contributes to versatility in dealing with widely different shapes and sizes of components, and whether they have standoff lead portions or not, resides in the provision of a composite spring means engageable with the undersides of the successive component bodies being conveyed, one leaf spring partly overlying and bearing on another in a manner to insure that the smallest as well as the largest (and intermediate) sized bodies will be caused to assume a optimum position prior to the interconnection of their leads as by tapes.

Yet another feature in the improved sequencer construction is embodiment at the delivery end of a component dispenser, especially one for releasing stand-off components to the conveyor, of one or preferably a pair of opposed component separator guides formed with component body engaging shelf portions whereby sprocket means associated with that dispenser can, not only sever each component from lead carrying tape, but enable successive endmost components to be released with proper orientation and without danger of jamming from adjacent components to be released.

BRIEF DESCRIPTION OF THE DRAWINGS

The foregoing and other features of the invention will now be more particularly described in connection with a illustrative embodiment, and with reference to the accompanying drawings thereof, in which;

FIG. 1a is a perspective view of a portion of a typical sequence of diverse components, stand-off and otherwise, as retaped and wound by the illustrative machine;

FIG. 5 shows in perspective the parts of FIG. 4 assembled;

FIG. 6 is a view similar to FIG. 5 showning the parts in relation to portions of the conveyor and lead taping wheels, successive positions of a disc cap as it is oriented being illustrated;

DESCRIPTION OF PREFERRED EMBODIMENT

It may be assumed for purposes of convenience that, unless otherwise noted, the illustrative machine is essentially as disclosed in the U.S. Pat. No. 3,669,309 above cited, though it will be understood application of this invention is not thus limited in use.

Figure 1:
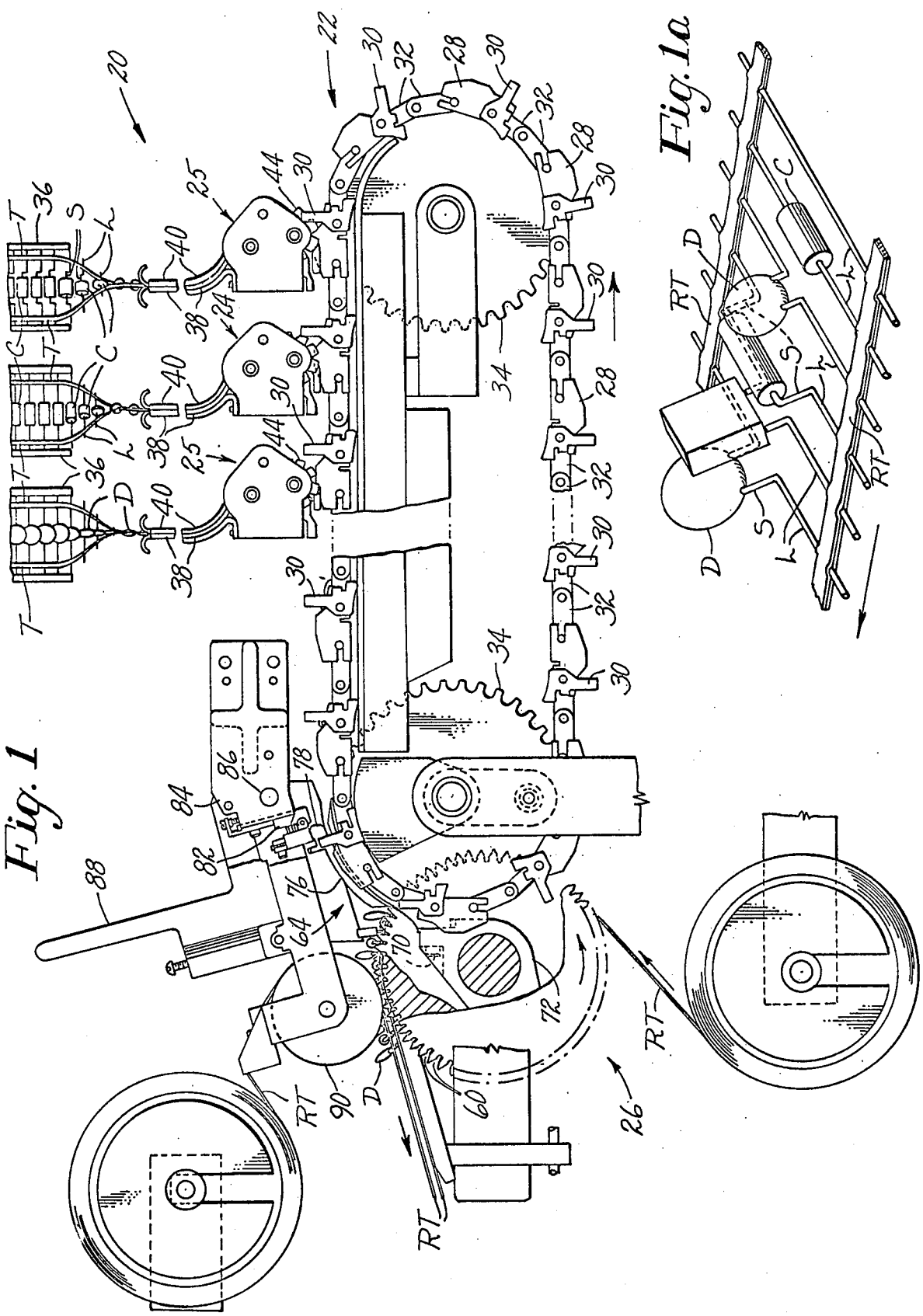
FIG. 1 is a view in side elevation, with portions broken away, of a sequencing machine in which the invention is exemplified, the view largely resembling FIG. 1 of the cited Romeo patent.

Referring first to FIG. 1, a sequencing machine generally designated 20 for taping electrical components C of diverse types and shapes, including disc caps D, and respectively having stand-off lead portions S and/or alternatively leads L that are essentially coaxial, includes an endless coveryor 22. The conveyor delivers them in selected side-by-side order from a plurality of dispensers 24,25, through a retaping station 26, to a suitable reeling station (not shown). Preferably the conveyor 22 comprises articulated carriers 28 respectively including laterally spaced plates and pairs of pivotal pick-offs 30,30 uniformly spaced therealong by a chain of links 32 arranged to travel over spaced sprockets 34,34 and beneath the delivery ends of the dispensers 24,25.

Though many of the dispensers 24 and their programmed actuating means may in general remain as hitherto disclosed, it is found that when any of the component bodies to be sequenced are non-cylindrical and/or have stand-off leads to be fed to the conveyor 22, which must function at good speed, novel modifications about to be explained are required as in the dispensers 25 to avoid having their components getting jammed prior to release from the respective dispensers, and to insure that each endmost component body when released assumes uniform and proper orientation for purposes of subsequent taping and reeling as will later be described. It will be understood that each dispenser 24 or 25 receives components of unique characteristics and normally interconnected at their outer lead ends as by tapes T, T so as to be fed in parallel from component supplier's reels 36 or the like and through vertical guideways 38,40.

As described in the mentioned U.S. Pat. No. 3,669,309, two coaxial pairs of synchronized and oppositely rotatable feed wheels 42,44 (FIGS. 2 and 3) uniformly index succesive pairs of leads. Corresponding teeth 46 of the upper wheels 42 advance coaxial outer lead portions downwardly in the upper half of an S-shaped path defined by the wheels 42, 44 and an inside edge of a guideway 48 secured to the frame, the outer portions of the leads and tapes T connecting them being severed and eliminated from the successive components by suitable shearing means such as axially spaced discs 50,50, one shown. Then the peripherally notched lower wheels 44 receive and advance the uniformly spaced and cut coaxial lead portions. As hitherto employed the arrangement described to this point satisfactorily handles non-stand-off lead arrangements and primarily cylindrical component bodies only. To enable stand-off, disc caps D and other types to be indexed and handled rapidly without jamming (as well as non-stand-off and cylindrical-bodied components to be processed), a separator means comprising one or a fixed pair of laterally spaced guides 52 (one shown) is provided in the dispensers 25. Each guide 52 includes an upper or horizontal stacking shelf portions 54 at about the level of the change in curvature of the S-shaped guideway 48 for supporting the bodies of one or more disc caps D. These have fallen due to gravity after the lead shearing and are monentarily stacked heightwise by the shelf 54. As the roots of the teeth 46 descend and travel to the left in FIG. 2, the trapped coaxial lead portions L of the successive disc caps D are moved leftward causing successive disc cap bodies to be drawn from the shelf 54. Then counterclockwise indexing of the teeth of the wheel 44 take over control of the leads further to move them downwardly and to the left thus advancing their disc cap bodies in sliding contact with inclined, stepped surfaces 55 and 56 of the guides 52. It is to be noted that the surfaces 55 are arranged to support a next to endmost disc cap D jointly with the wheel 44 and in a position to prevent the disc cap from falling and interfering with the endmost disc cap D then about to be picked off by the conveyor pick-off 30,30 then next passing leftward.

In the dropped or ready-for-pick-off position of the endmost disc cap, its body is inclined approximately 15° to the horizontal along with the stand-off lead portions S which lead the body in the direction of conveyor movement. Thus the coaxial lead portions L are lower and engageable by the pick-offs 30, respectively. To prevent the leads L from bouncing too far ahead or askew upon pick-off impact, a deflectible, normally vertical, soft rubber apron or retrader 58 (FIGS. 2,3) suspended just to the left of the feed wheel 44 is provided. The body of the disc cap D being picked-off is supported frictionally preferably until its leads are advaced about half the length of the disc cap body, whereupon the body is tranferred, properly oriented, onto the conveyor chain 32 with the coaxial lead portions L prependicular to the direction of feeding.

Release of the respective components by their dispensers 24,25 in selected, i.e. preprogrammed order to the conveyor 22 is effected by appropraite means (not shown), for instance the computer controlled solenoid means disclosed in the mentioned Romeo patent. As therein described the spaced successive carriers 28 respectiely deliver a selected component for retaping to aligned peripheral pairs of tooth spaces 60,60 of the retaping wheels 26 (FIGS. 1,7 – 9), the speed of rotation of the later being synchronized with, buth much reduced from, the speed of the conveyor 22. Transfer of the successive components from the conveyor to the taping wheels 26 is effected continuously as the coaxial pairs of lead portions L emerge from beneath lower arcuate edges of a pair of spaced parallel guide plates 62,62 secured to the machine frame, the pick-off plates 30,30 being then allowed to pivot clockwise to a non-interference position. Additional component orienting and transfer mechanism generally designated 64 (FIGS. 4 – 6) next to be described is required for insuring that the diverse components can be received from the conveyor 22 and compactly accommodated by the wheels 26 prior to retaping, and in a uniform manner that will enable the components to be reeled for storage and later when unreeled, rendered appropriately feedable to an automatic insertion machine.

Figure 4:
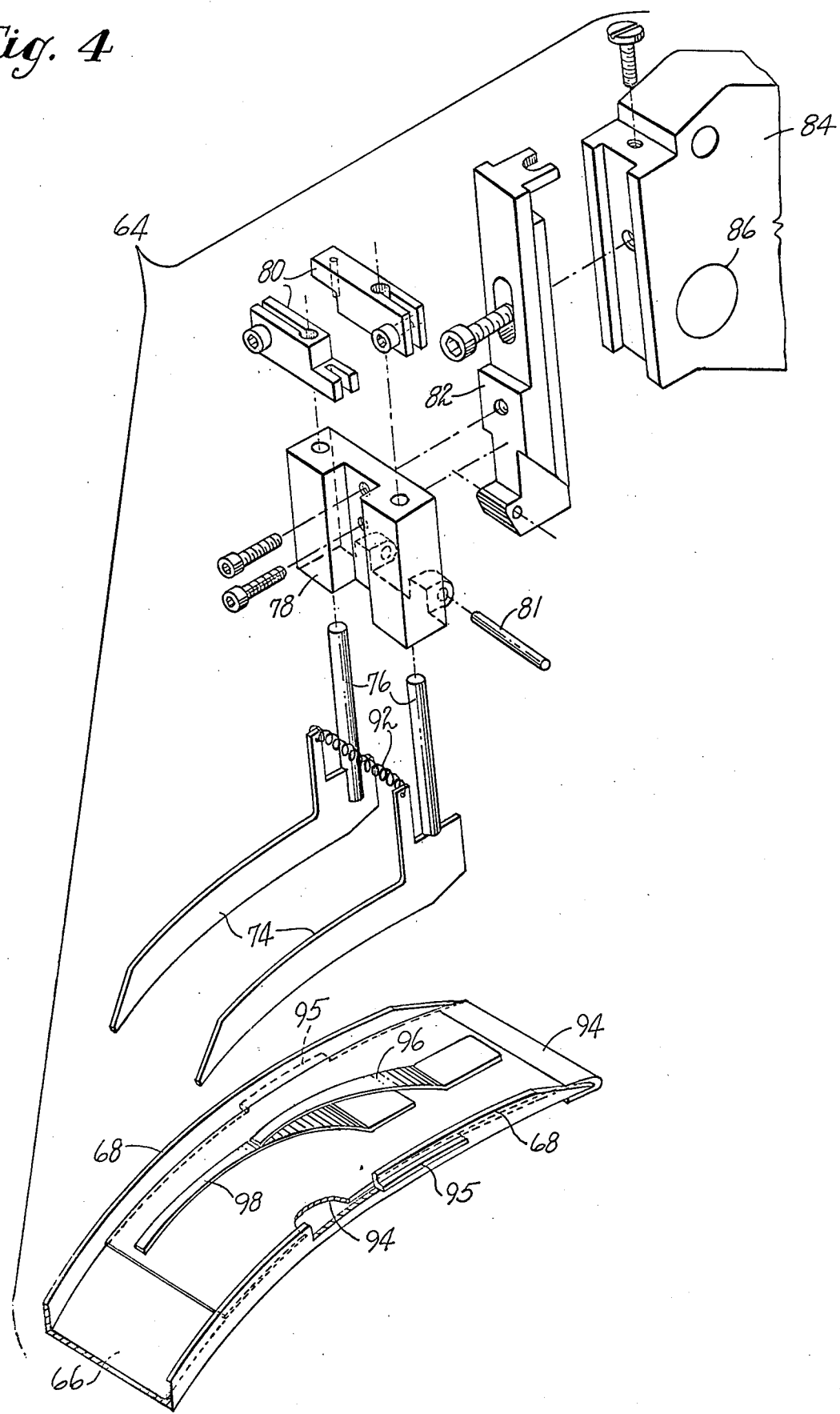
FIG. 4 is a exploded perspective of transfer mechanism cooperative with the conveyor just ahead of a lead taping zone for centering the components travsversely of the conveyor path and with bodies uniformly inclined to the tapes of be applied.

Mainly referring to FIGS. 4 – 6, for providing laterally spaced lower guide surfaces of an arcuate passageway leading to the path of the successive tooth spaces 60 and partly defined by the lower edges of the plates 62,62, the mechanism 64 includes a channel 66 having upstanding curved side rail portions 68,68 engageable with the oppositely extending coaxial lead portions L. The channel 66 is secured at its lower end as by a bolt 70 (FIGS 1,7,8) to a frame portion 72 in which the retaping wheels 26 are journalled. As perhaps most clearly seen in FIG. 6, the upper end of the channel 66 extends lengthwise midway between parallel rows of the links 32. For centering the leads and bodies of the differently shaped components as they progress through the channel 66, and without interfering with orienting means later to be explained, a pair of leaf springs 74,74 (FIGS 4 – 6) is pivotally supported within the channel 66 by pins 76,76, respectively mounted at their upper ends for turning about their axes in a block 78 as by adjusting clamps 80,80. The block 78 is fulcrumed on a pin 81 carried in a support 82 (FIGS. 1, 4 and 5) adjustable vertically in ways in a frame portion 84 (FIGS. 1 and 4) journalling a tranverse pivot pin 86. It will accordingly be understood that a hand lever 88 (FIG. 1) mounted on the pin 86, when used in shifting pressure applying rolls 90,90 (FIGS. 1 and 9) to and from cooperative relation with the retaping wheels 26,26 is also useful in moving the centering springs 76,76 to and from operative relation with the channel 66. To insure transverse centering of the differnt bodies and their standoff lead portions S, a tension spring 92 interconnecting the leaf springs 74,74 urges them to converge at a downstream end unles yieldingly separated by a component body C or D or its stand-off leads S as they progress through the channel 66.

Figure 7:
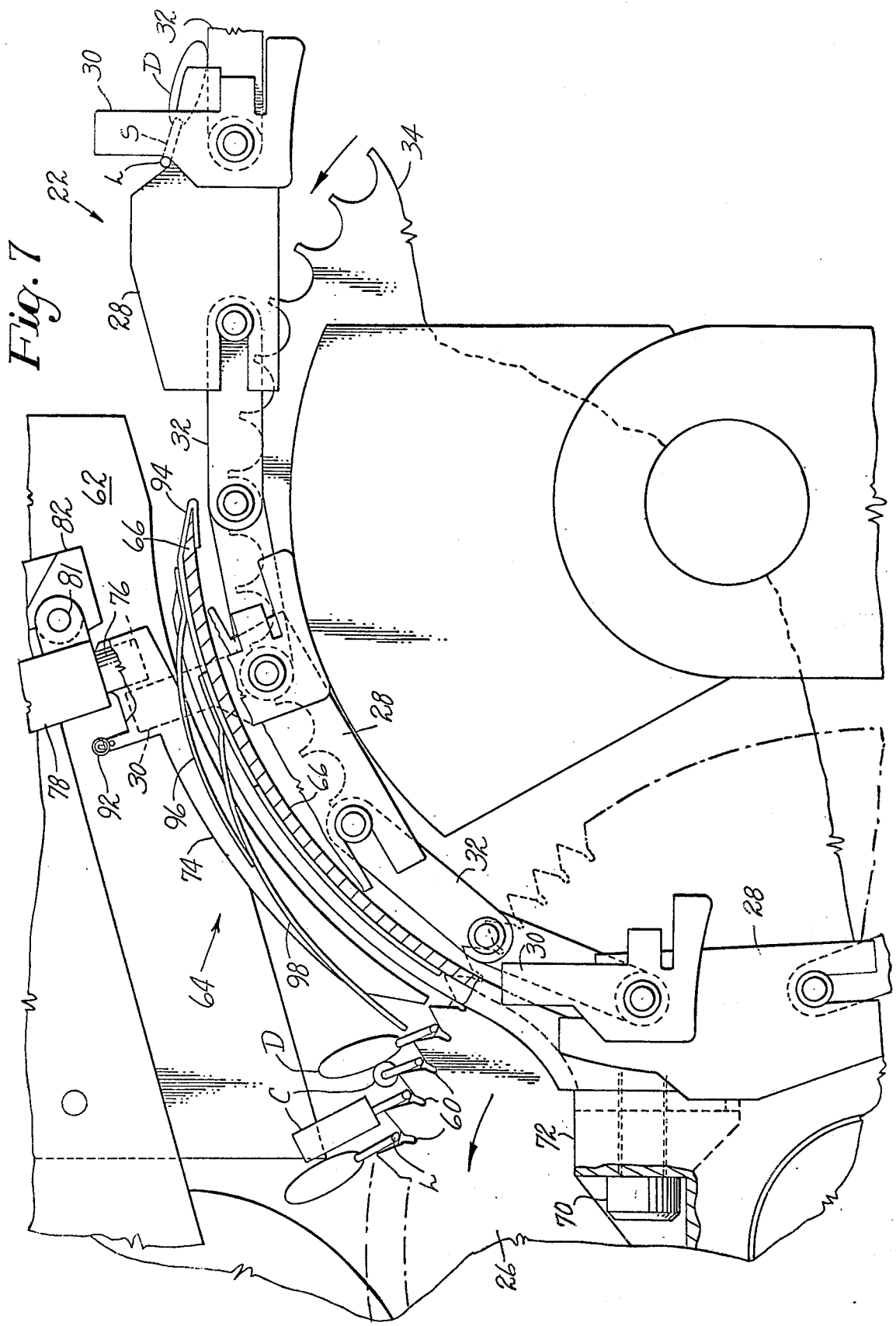
FIGS. 7 and 8 are views in side elevation and on a larger scale respectively showing unflexed and flexed positions of the transfer mechanism of FIGS. 4 – 6 which orients components being fed into the tape applying wheels, and regardless of size of component body.
Figure 8:
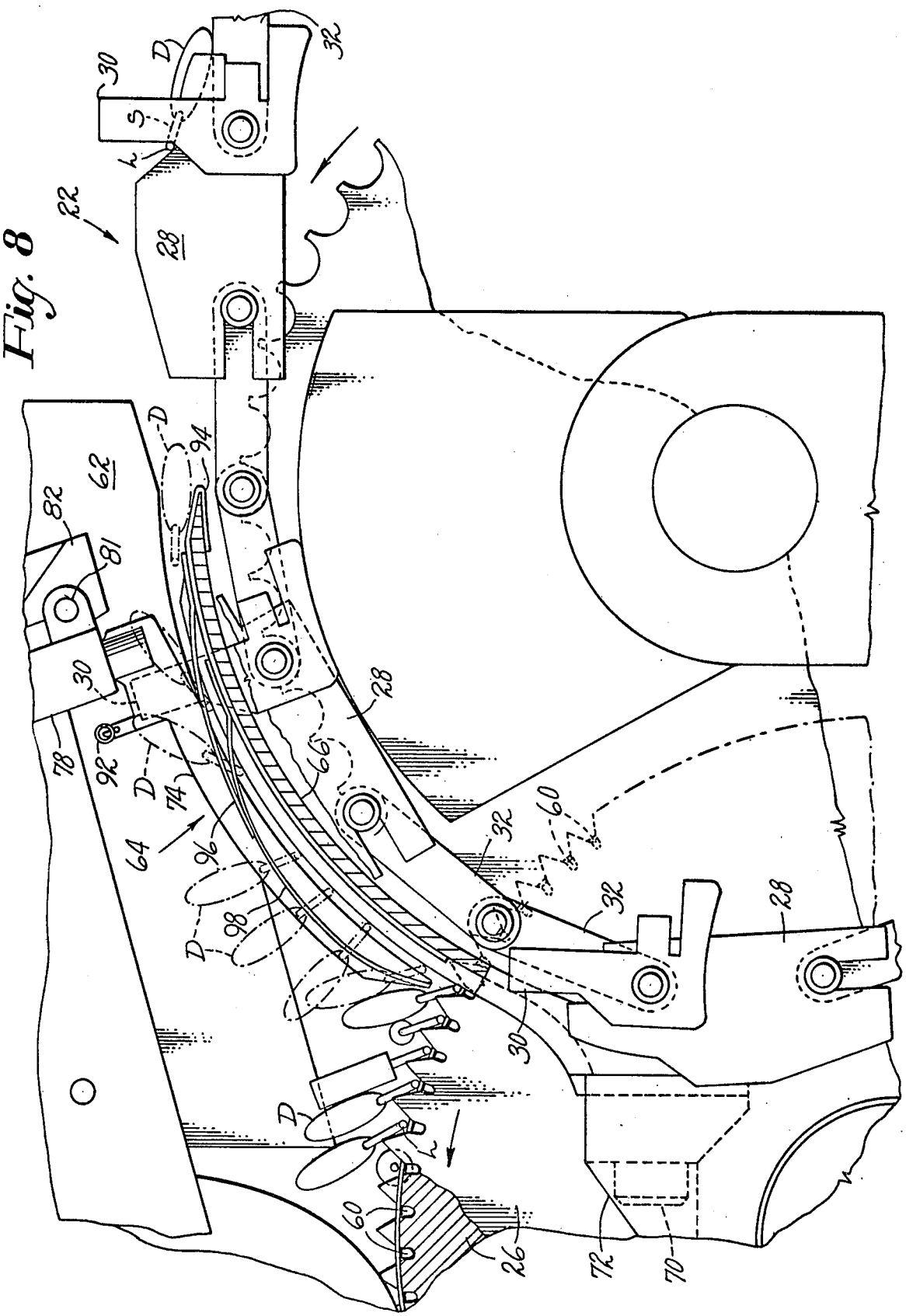
Figure 9:
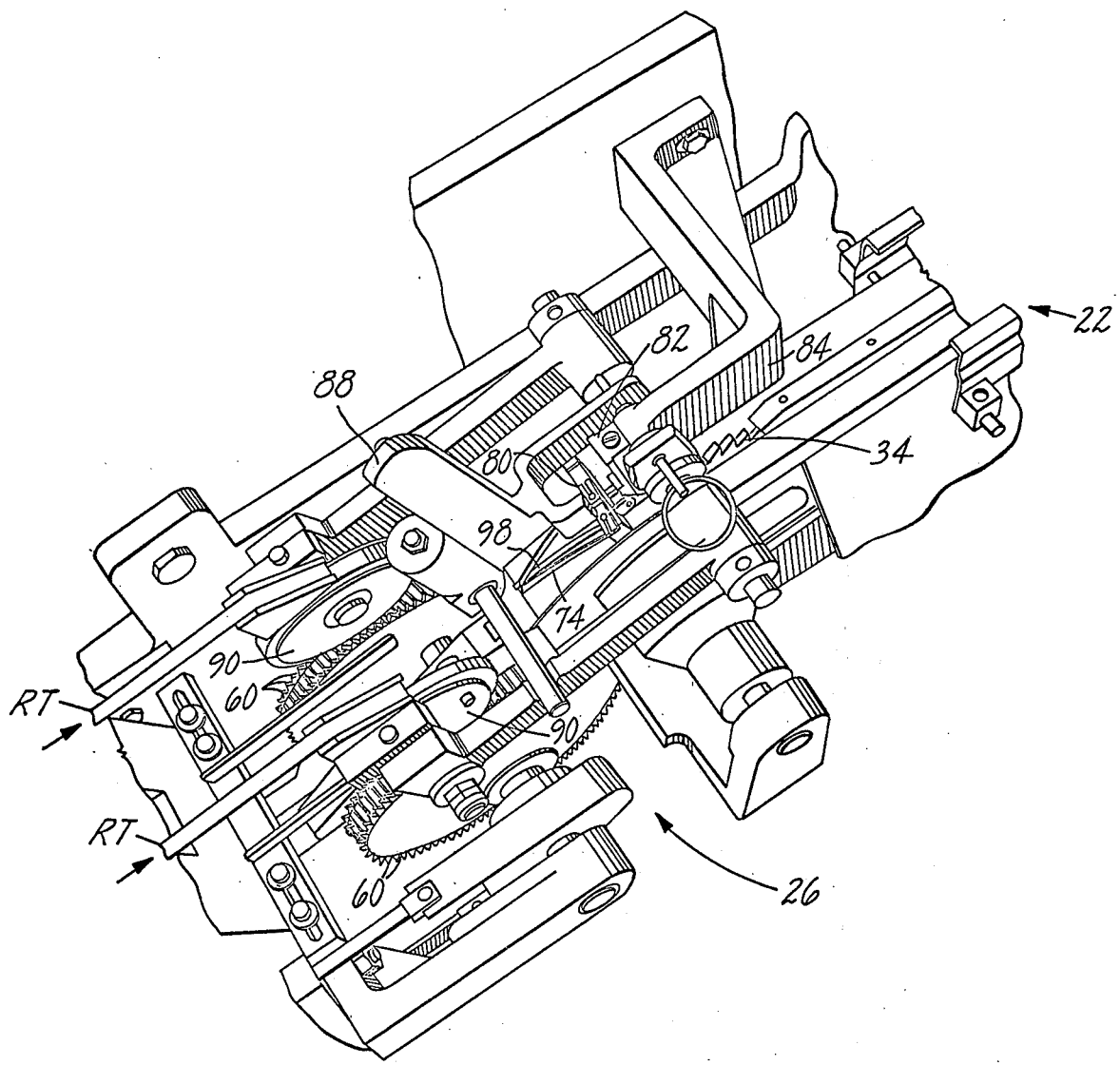
FIG. 9 is a perspective view from above of mechanism shown in FIG. 1 and FIGS. 4 – 8.

As has been indicated a disc cap D or other stand-off component trails its stand-off leads S and its coaxial lead portions L as it arrives at the mouth of the channel 66 as inciated in FIG. 6, but it is required that when they are to be taped by the wheels 26 they shall be uniformly inclined so as to be ahead of their lead portions as shown in FIGS. 1, 7 and 8. For accomplishing this the transfer mechanism 64 being described applies a torque or moment for progressively turning each component body about the axis of its coaxial leas portion L. Several alterative variants serving this function are found possible, one presently preferred body tilting arrangement being next explained. An arcuate, thin sheet metal piece 94 (FIGS. 4 – 8) has its components receiving end hooked over the upper end of the channel 66, and has laterally spaced key portions 95,95 which, after tranversely bending the piece 94, are receivable in locking slots formed in th side rail portions 68, respectively. This piece 94 serves as a mounting means for a pair of arched and aligned, longitudinally tapering springs 96,98. The stronger, i.e. stiffer spring 96 preferably has its free downstream portion overlying about one-half of the weaker spring 98, their upper ends being attached to the piece 94 as by spot welding. A simpler alternative construction might, for example, simply employ a single leaf spring which could be attached directly to the channel 66 thus eliminating need for the piece 94. The preferred two-spring 96,98 arrnagement shown in believed advantageous in dealing properly with reorienting stand-off component bodies of the smallest to the largest in a usual range of sizes.

As illustrated by progressive steps in FIG. 6 with disc caps D, but applicable to other stand-off components C as well (and also passively permitting passage of components having only coaxial lead L), tilting of the stand-off bodies from lead-trailing to lead-advancing condition is caused by the springs 96,98 in succession frictionally bearing upwardly on the lagging body to left it with moment about the axis afforded by its constrained coaxial lead portions L as they are advanced by the conveyor pick-offs 30,30. Though coaxial leads are usually deposited in the successive tooth spaces 60, it will be understood with particular reference to FIGS. 7 and 8 that only one component C or D is actually being deposited after being up-tilted into lead-advancing relation as the next component is being received at the upper end of the tranfer channel 66. Composite spring means 96,98 insures that the bodies D will be shifted from the initially horizontal condition to one beyond vertical, as shown in FIG. 8, wherein the bodies overlap in compact arrangement ready to be taped. Tapes RT for retaping may then be supplied by suitable means such as disclosed in the cited Remeo patent.

Figure 2:
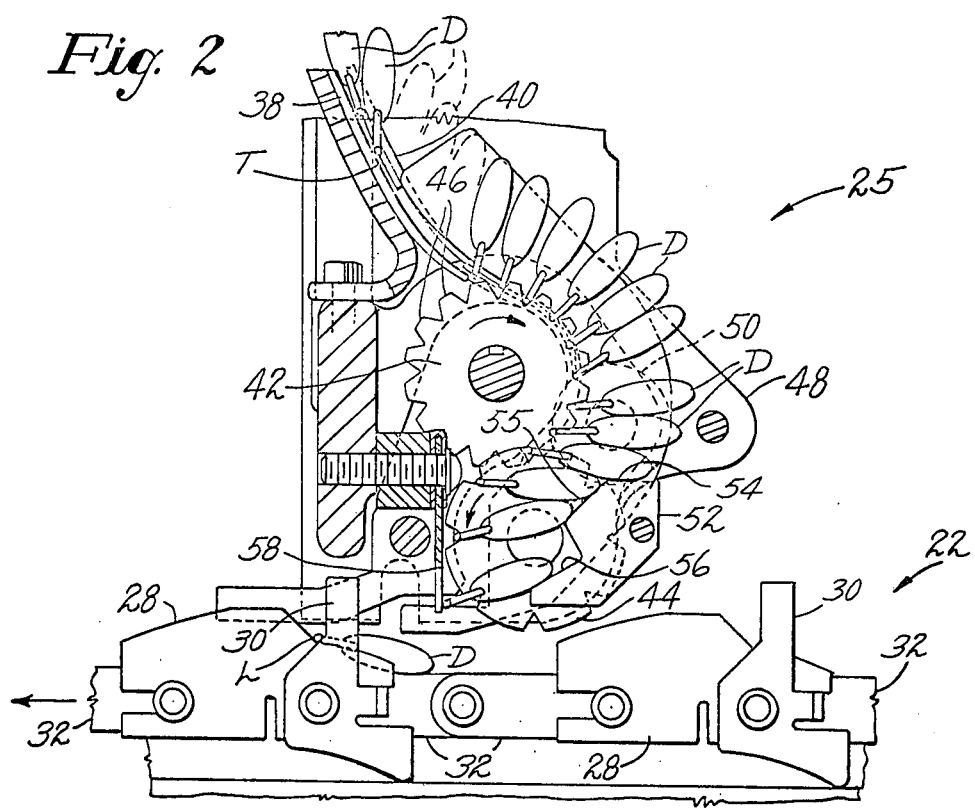
FIGS. 2 and 3 are sequential views, partly in section, illustrating indexing and separator means associated with a dispenser of stand-off components.
Figure 3:
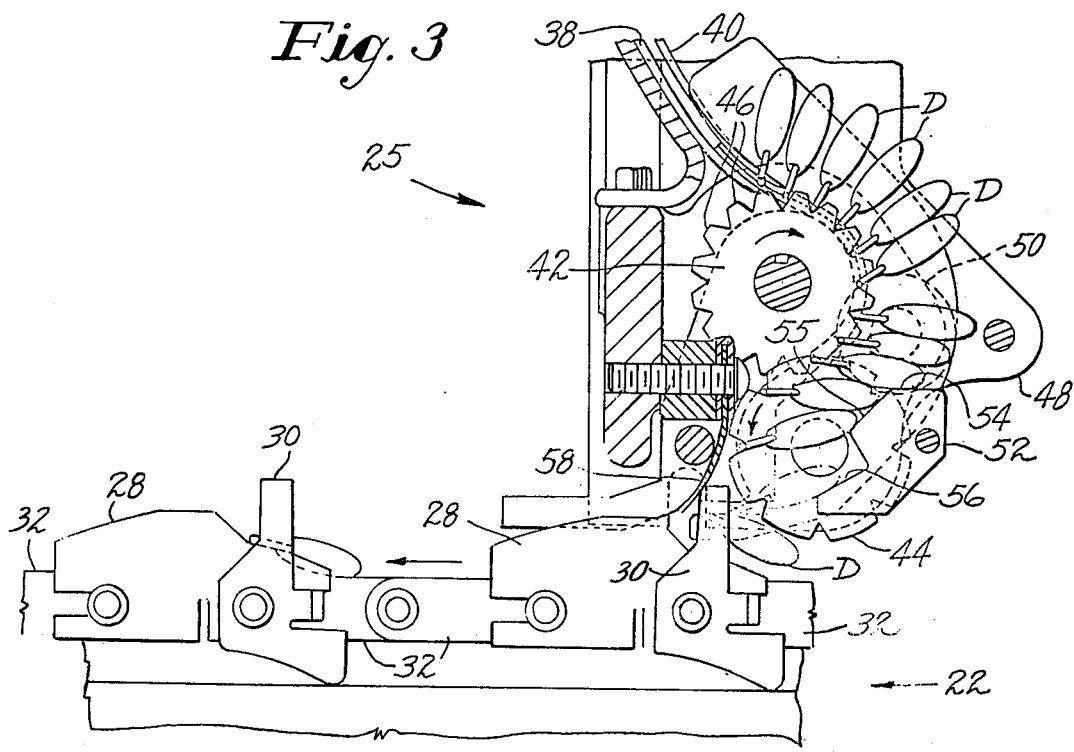

Briefly to review operation of the machine 20, the series of dispensers 24,25 respectively receive taped components having whooly coaxial leads L and partly coaxial, partly stand-off leads L, S. They deposit the components successiely upon signal to each carrier 28 of the conveyor 22 when engaged by the pick-offs 30, the initial tapes T having been eliminated by the cutters 50 (FIGS. 2 and 3) cooperating with the indexed teeth 46. Each of the dispensers 25 includes the separator guides 52 with their stepped shelves 54, 55, 56 which enable bodies of the disc caps D, for instance, to be maneuvered singly without their leads becoming entangled, to the end that each endmost component is deposited with its leads foremost in the direction of conveyor travel. The spacing and inclination of the shelves 54, 55, and 56 enable the peripheral notches of the dispensing wheel 44 in conjunction with the guideway 48 to index the coaxial lead portions such that their respective component bodies lag and are discretely deposited between the chain links 32 as shown in FIGS. 2, 3.

As the conveyor carriers 28 successiely pass over the left hand sprocket 34 (FIGS. 1, 7, and 8), bodies of the components C or D are received in the channel 66 of the transfer mechanism 64 (FIGS. 4 – 6) and transversely centered by the leaf springs 74,74. As this centering proceeds, any stand-off components will have their bodies engaged and urged upwardly by the sprngs 96,98 acting in succession to impart a moment for turning them counterclockwise about their coaxial lead axis. This occurs while the respective pairs of coaxial lead portions L,L are slidably confined in the arcuate passgeway defined by the rails 68,68 on the underside and the lower edges of the paralled guide plates 62,62. The successive component bodies C or D, if need be, are accordingly shifted to a position ahead of their coaxial lead portions L, and by the time that a pair of pick-offs 30,30 ceases to advance the lead portions L, their component body and any stand-off lead portions S will have been urged by the spring 98 ahead of the axis of the portions L, L, gravity then aiding to maintain this relationship until the retaping wheels take control.

The retaping means need not here be described further except to say that, when the sequenced and aligned diverse components emerge retaped and with compact and uniform orientation, they can be reeled up for storage and subseqently fed directly to an inserting machine. Withough provision of the new dispensers 25 and the transfer mechanism 64, the stand-off type components could not be thus rapidly processed and, obviously, insertion could not be automatically effected by the machine if any of the component bodies then proceded their coaxial leads.

Having thus described our invention what we claim as new and desire to secure as Letter Patent of the United States is:

1. In a sequencing machine comprising a conveyor and a plurality of dispensers including a guideway for respectively releasing successive components, each component comprised of a body and leads projecting therefrom, to be deposited into the path of feed of the conveyor, the conveyor having uniformly spaced pick-off elements engageable with coaxially extending lead portions of the successive components, at least one of the dispensers being adapted to release components of the type having coaxial lead portions and generally parallel stand-off lead portions adjacent their respective bodies, a separator means associated with the dispenser guideway near the delivery end of said dispenser, the separator means comprising a sprocket means for successiely feeding the components in the guideway by their coaxial lead portions, and at least one guide having stepped supporting shelves extending heightwise and progressively engageable by the component bodies to enable separation and release of each component body to said conveyor in predetermined angular relation it its coaxial lead portions.

2. In a machine for sequencing diverse electrical components having their leads at least in part extending coaxially from their respective component bodies, means for conveying the components in a row, and a plurality of dispenser means resectively including at least one peripherally notched wheel for indexing the successive components to be released to the conveyor, one of the dispenser means comprising an arcuate guide means for the coaxial lead portions being advanced by the wheel, and a separator guide axially offset from said arcuate guide means and formed with a surface disposed to be slidably engageable by the bodies of the components having indexing of their coaxial lead portions jointly controlled by the wheel and said arcuate guide, said separator guide surface being shaped to momentarily stack and then rotate successive engaged bodies relative to the axis of said coaxial lead portions to obtain their uniform orientation on said conveyor.

3. A machine as in claim 2 wherein the arcuate guide means comprises a pair of spaced, parallel plates the inner guiding edges of which are S-shaped to accommodate the feed wheels and the notched indexing wheel, and the separator guide has a shelf portion disposed to slidably engage successive component bodies as they descend at substantially the level of the change in curvature of said S-shaped guiding edges.

4. A sequencer for electrical components having their leads at least partly in coaxial relation, comprising a conveyor for advancing the components in a row with their bodies respectively trailing their leads, and a plurality of dispensers arranged in alignment with the conveyor for releasing successive components thereto, at least one of said dispensers comprising an arcuate guideway, a wheel cooperative with the guideway for advancing coaxial lead portions downwardly therein toward the conveyor, and a separator having a substantially horizontal upper stacking and lower relatively inclined surfaces slidably engageable by the bodies of the components as their leads descend in the guideway for deposit on the conveyor.

5. A sequencer as in claim 4 adapted to proces disc cap components having bodies elliptoidal in cross section wherein said one dispenser includes a separator, two inclined surfaces of which extend heightwise just above the conveyor with different inclination thereto.

* * * * *

UNITED STATES PATENT OFFICE
CERTIFICATE OF CORRECTION

Patent No. 4,034,893          Dated July 12, 1977

Inventor(s) Armand L. Tardiff et al.

It is certified that error appears in the above-identified patent and that said Letters Patent are hereby corrected as shown below:

Claim 1, Column 8, line 2, delete the word "it" and insert -- to --.

Signed and Sealed this

Twenty-seventh Day of September 1977

[SEAL]

Attest:

RUTH C. MASON  
*Attesting Officer*

LUTRELLE F. PARKER  
*Acting Commissioner of Patents and Trademarks*